United States Patent [19]

Daiger et al.

[11] Patent Number: 4,670,750
[45] Date of Patent: Jun. 2, 1987

[54] PHOTOELECTRIC IMPULSE TRANSMITTER

[75] Inventors: Robert Daiger, Villingen-Schwenningen; Kurt Hoeren, Brigachtal; Dietmar Hummel, Villingen-Schwenningen, all of Fed. Rep. of Germany

[73] Assignee: Kienzle Apparate GmbH, Fed. Rep. of Germany

[21] Appl. No.: 707,055

[22] Filed: Mar. 1, 1985

[30] Foreign Application Priority Data

Mar. 1, 1984 [DE] Fed. Rep. of Germany ....... 3407590

[51] Int. Cl.⁴ ............................................. G08C 19/36
[52] U.S. Cl. ............................. 340/870.29; 340/870.04
[58] Field of Search ....................... 340/870.29, 870.04, 340/347 P; 250/231 SE; 73/1 D

[56] References Cited

U.S. PATENT DOCUMENTS 3,728,551 4/1973 Culver et al. ................. 250/231 SE
4,338,517 7/1982 Perrine .......................... 250/231 SE
4,360,730 11/1982 Breslow ........................ 250/231 SE

FOREIGN PATENT DOCUMENTS 1573089 8/1980 United Kingdom ............ 340/347 P

*Primary Examiner*—Jerry W. Myracle
*Attorney, Agent, or Firm*—Toren, McGeady and Goldberg

[57] ABSTRACT

Measured values are converted into electrical impulses for gauge devices and the like in a mechanism including a plurality of photocells arranged on a generally circular arc with a rotatable disc having angularly spaced radially extending slots arranged for movement relative to the photocells to energize and deenergize them in accordance with the angular spacing of the slots in the disc. Electrical circuitry operates to emit electrical impulses responsive to the energization and deenergization of the photocells and the photocells are mounted to enable their positioning relative to the rotational axis of the disc to be adjusted, thereby to enable adjustability relative to the emitting of the electrical pulses.

10 Claims, 5 Drawing Figures

PHOTOELECTRIC IMPULSE TRANSMITTER

The present invention relates generally to gauge devices and more particularly to a photoelectric impulse transmitter for transposing measured digital values in the form of rotary motion into impulses for utilization in the gauge devices, whereby the impulses are generated by circuit means controlled by a rotational device.

In a device, in accordance with the present invention, the rotational device comprises a slotted disc and it is arranged to operate within the light path of a photocell.

In known prior art devices of the type to which the present invention relates, there are utilized on the transmitter side a modulated light source for the photocell which is mostly in the form of a Ga-As-luminescent diode. On the light receiver or sensor side of the photocell, a photo structural element having properties specified for the particular utilization involved is provided. The modulation is achieved mechanically in a simple manner by means of perforated or slotted discs. Impulses are produced by the slotted disc which is attached to a rotatably supported shaft and which alternately interrupts the light beam in the photocell. The number of impulses per revolution is determined by the number of teeth arranged at the circumference of the slotted disc, the teeth each being located between a pair of adjacent slots.

On the receiver or light sensor side of the photocells, there are provided photo structural elements which are respectively selected in accordance with the utilization which is to be involved with a view toward the required sensitivity and structural formation. In a common embodiment, these will comprise silicon-photo-transistors which may be switched together in a combination of two or more transistors forming a so-called photo darlington. This serves to magnify the photoelectric current and thereby improves the sensitivity of the phototransistor. However, response time is correspondingly increased.

In order to achieve photocells which display characteristics as constant as possible, the light source and the photoelectric light sensor are arranged in an optimum functional position relative to each other and in order to maintain this position, the photocells are embedded in molded resin blocks. Such photocells have become known as so-called fork photocells because of the fork-shape arrangement of the light source relative to the light sensor between which, for example, a slotted disc is moved as a modulator. Even this fixed positional arrangement of the structural elements with respect to each other has been found to eliminate differences in fluctuating operating characteristics. The reason is deemed to be that, inasmuch as the individual structural elements comprising the photocell, i.e., the light emitter and the light sensor, are not of uniform technical quality and that despite precise mechanical arrangement, variable switching characteristics unavoidably arise depending upon the tolerances of the equipment and the technical quality thereof. Only after accomplishment of certain predetermined test conditions over a specified measuring series can the ranges of a plottable signal generation be determined and recorded in data sheets for the individual photocells.

In U.S. Pat. No. 2,656,106, there is disclosed a photoelectric position-indicating device for a shaft which is rotatable in two directions. The device consists of one slotted disc and two photocells arranged in the area of the slots on the disc at a specified rotational angular distance from each other. By rotation of the slotted disc, impulse sequences separate from each other are generated in the photoelectric sensor elements as a result of interruption of the light beam of the photocell and depending upon the number of slots arranged at the circumference. Utilization of two photocells serves, among other things, to determine the direction of rotation with the assistance of the two impulse sequences. The edges between which the slots are defined in the slotted disc are located so as to extend exactly in a radial direction from the center of rotation of the disc. As a result, when the slot edge moves through the light beam of the photocell, only the shortest possible angular range is available for a modulation phase. This angular range which is as short as possible does not suffice to cover a switch hysteresis of the photocell and additionally a possible reverse movement blocking tolerance of the shaft. Shifting of the impulse edge is, however, not possible. As a consequence thereof, erroneous impulses are generated in the immediate area of the switching zone which tend to detract from the accuracy of the counting or gauging process. Once these erroneous impulses have been produced by the photocells, they can only be identified with great difficulty and at considerable expenditure with the regard to the electronic circuitry involved.

In U.S. Pat. No. 3,436,655, there is described a shaft revolution counting device which is particularly designed for measurement of the number of revolutions per minute time for very slowly rotating shafts. An accurate measurement of a slow rotational movement is normally difficult because the rotating shaft flutters or vibrates in the direction of motion. It is almost impossible to eliminate this phenomenon and, therefore, attempts have been made to eliminate the effects thereof. For this purpose, two photocells are staggered in the angular rotational direction in such a manner that the first and second photocells never cross a light path simultaneously. The two photocells are connected with a resonance-relay flip-flop circuit by means of which flutter phenomena in the switchover phase are eliminated. The slotted disc exhibits narrow, radially extending slots between which relatively wide zones are provided which do not allow any light to pass. The modulator zone for the photocell is thus equally limited to a minimum rotational angle which does not allow for correction of switching hysteresis of the photocell. The position of the edges of the impulse train at the output of the flip-flop cannot be altered and also with respect to the impulse-interval-relationship of the impulse signal at the output of the flip-flop, no correction is possible.

In the rotational impulse transmitters disclosed in DE-OS 27 26 242, an attempt is made to effectuate an improvement by means of a special arrangement and design of the slot shapes on the modulator disc. A slotted disc shutter is provided which is comprised of a pair of coaxially assembled identical slotted discs which are rotated with respect to each other in order to permit fixed adjustment of the shutter to a specific tooth-gap-relationship and arrangement of the teeth and gaps deviating from a radial-inclined, as it were, in a tangential direction, permits however merely adjustment of a linear change in the tooth-gap-relationship which is expressed in a corresponding impulse-interval-relationship of the impulse signal. It is, however, not possible by means of this arrangement to shift the leading edges and trailing edges of the impulse waveform with respect to each other and to assign the two impulse sequences diverse impulse-interval relationships.

Accordingly, the present invention is directed toward providing a mechanical adjustment capability with simple means in an impulse transmitter of the type described, whereby the impulse-interval-relationship of the impulse sequence or waveform may be varied and additionally whereby a stagger of the two impulse sequences is adjustable and thus circuit effects generated by the system and construction parts are largely eliminated and the switching hysteresis of the photocells with reference to a reverse motion block can be expanded at the modulator disc. Over and above this, the circuit arrangement is designed in a compact structural form as a precondition for the installation in a pressure-tight or resistant encapsulation.

SUMMARY OF THE INVENTION

Briefly, the present invention may be described as a photoelectric impulse transmitter for converting measured values into electrical impulses for gauge devices or the like comprising a plurality of photocells each including a light source and a light sensor arranged on a generally circular arc with a disc rotatable about an axis and having slotted portions formed with angularly spaced radial slots arranged for movement along the circular arc of the photocells between each of the light sources and light sensors thereof.

The slotted disc operates to intermittently block and transmit light between the light source and light sensor of each of the photocells depending upon the location of the slots, i.e., each time a slot passes the light beam of a photocell, a photocell is energized, thereby to intermittently energize and deenergize each of the photocells in accordance with the angular spacing of the slot. The photocells are connected in electrical circuit means which emit electrical pulses responsive to energization and deenergization of the photocells. The invention is particularly directed toward provision of adjustment means which enable adjustable positioning of the photocells relative to the axis of rotation of the slotted disc, thereby to enable adjustability with regard to the emission of electrical pulses by the electrical circuit means.

In accordance with a more specific aspect of the invention, four photocells are provided in a fixed arrangement on a printed circuit board and the circular arc upon which the photocells are arranged has an average radius of one slotted disc modulator zone at equal angular rotational differences from each other. The printed circuit or wiring board with the four photocells is adjustable by means of parallel displacement and rotation of the position with reference to the modulator zone in such a way that by means of variability of position of the photocells, a balance of an impulse-interval-relationship as well as a mutual stagger of the two impulse sequences is adjustable.

Based upon a specific equal angular distance of the four photocells from each other, four timewise-delayed switching impulses result sequentially depending upon the rotational speed of the slotted disc. If, in the original adjustment of the photocells, the switching impulses are applied to the inputs of two flip-flops of the indicated electrical circuit means, then two rectangular signals phased 90° from each other are formed at the outputs of the flip-flops. Based upon the fixed arrangement of the four photocells on the printed circuit board and the variable adjustment of the printed circuit board with reference to the modulator zone, other angular positions of the light barriers with respect to each other can be adjusted by shifting or turning of the printed circuit board. Through this, the passage intervals between the individual switching impulses are changed at the same time. Consequently, this leads to a corresponding shift of the output signals at the flip-flops. Based upon the mechanically adjustable printed circuit board, the impulse-pause-relationship and the stagger of the rectangular signals of the first impulse sequence with respect to the rectangular signals of the second impulse sequence can be accurately balanced in the simplest manner.

The various features of novelty which characterize the invention are pointed out with particularity in the claims annexed to and forming a part of this disclosure. For a better understanding of the invention, its operating advantages and specific objects attained by its use, reference should be had to the drawings and descriptive matter in which there is illustrated and described a preferred embodiment of the invention.

DETAILED DESCRIPTION OF THE PREFERRED EMBODIMENT

Figure 1:
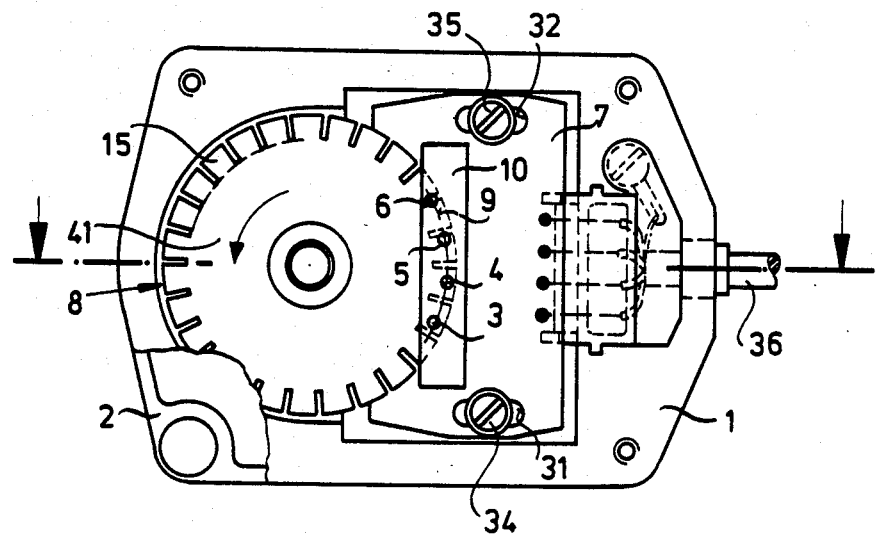
FIG. 1 is a front view of an impulse transmitter shown with a housing cover thereof removed.
Figure 2:
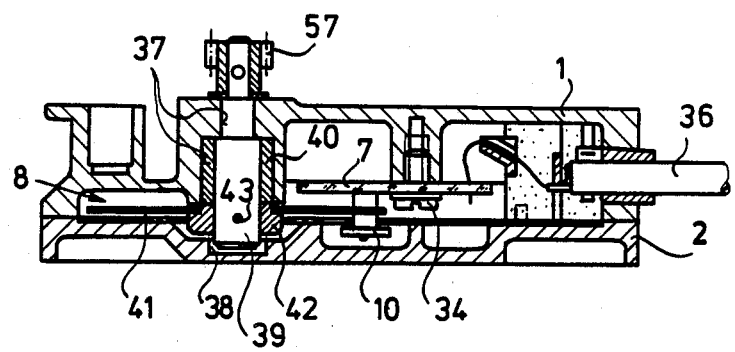
FIG. 2 is a cross-sectional view of the device shown in FIG. 1.

Referring now to FIGS. 1 and 2, there is shown the basic elements of the present invention which comprises an impulse transmitter which may be used, for example, in fuel dispensing pumps for the transmission of volume unit information determined by a measuring mechanism to a price calculating and display mechanism.

The impulse transmitting system is mounted within a housing 1 and consists essentially of four separate photocells 3, 4, 5 and 6, which are arranged on a printed circuit or wiring board 7. The device also consists of a slotted disc 8 which operates as a modulator element.

The photocells 3, 4, 5 and 6 may be commercially available photocells, each including a light source 16, 17, 18 and 19 and a light receiver or sensor 11, 12, 13 and 14. Thus, for example, the photocell 3 will be seen to comprise a light source 16 and a light sensor 11, the photocell 4 a light source 17 and a light sensor 12 and, similarly, photocells 5 and 6 will comprise, respectively, elements 18, 13 and 19, 14. The light sources 16–19 may comprise diodes, for example, Ga-As diodes.

The light sensors 11–14 may comprise photo-transistors. The operation of the photocells will be in accordance with known devices of this type and when an object is moved through a light beam of a photocell, for example, between the diode 16 and the photo-transistor 11 of the photocell 3, then the light impinging upon the photo-transistor 11 will be changed. The photocell will, therefore, emit a signal indicating this change.

Figure 5:
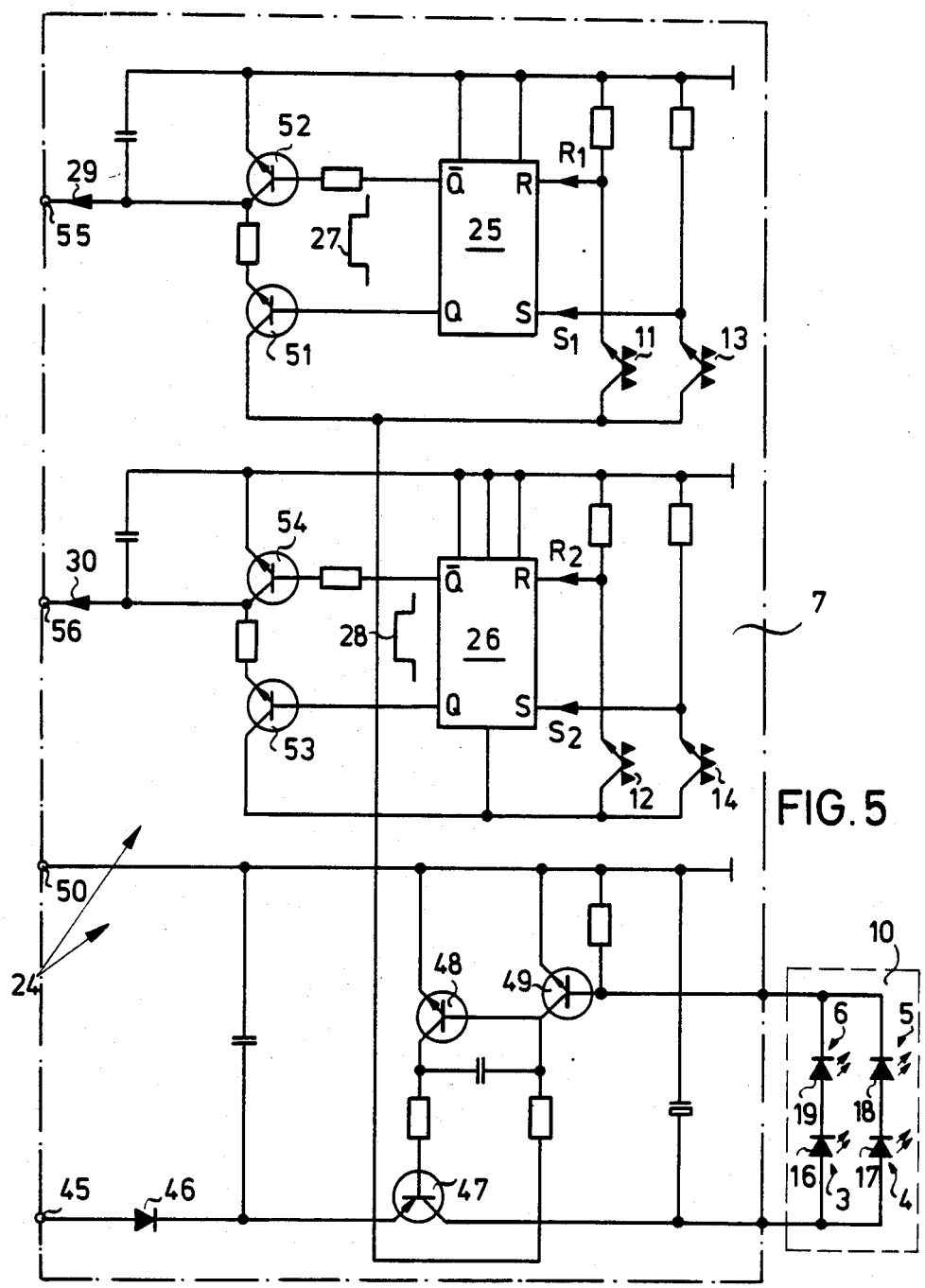
FIG. 5 is a circuit diagram of the circuit means of the invention.

Each of the photocells 3-6 is connected with electrical circuit means in accordance with a circuit arrangement shown in FIG. 5, whereby the photoelectric current of the photocell is magnified in order to generate a suitable control signal at the output side of the impulse transmitter.

Figure 3:
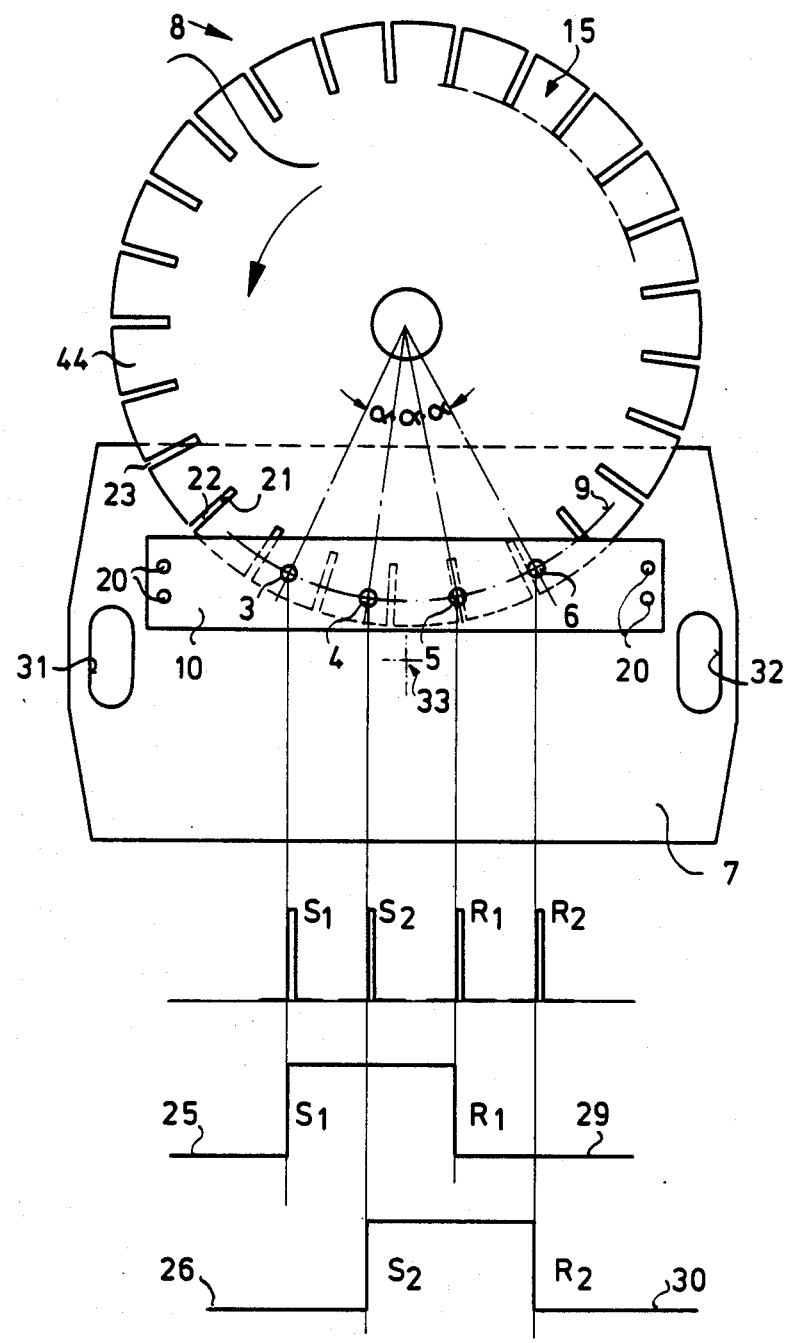
FIG. 3 is a schematic representation of the arrangement of parts of the device of the invention also depicting a graphical illustration of waveforms emitted as a result of the operation thereof.

As best seen in FIG. 3, the device includes a printed circuit board 7 and a strip 10 and it will be noted that the photocells 3-6 are arranged on a circular arc 9. The four photodiodes or light sources 16-19 are mounted on the strip 10 and the four light receivers or photo-transistors 11-14 are mounted on the printed circuit board 7. As will be noted from FIG. 3, the slotted disc 8 is arranged for rotation about a central axis so as to pass between the light sources 16-19 and the light sensors 11-14 and between the printed circuit board 7 and the strip 10.

The slotted disc is formed to comprise a plurality of radially extending angularly spaced slots 23 which are arranged about the outer periphery of the disc 8. The slots extend over a radial distance to define a modulator zone 15 on the disc 8. The radius of the circular arc 9 upon which the photocells 3-6 are arranged corresponds to an average radius of the modulator zone 15.

In order to supply current to the diodes 16-19, the strip 10 is equipped with correspondingly positioned conductor tracks which are connected with soldered or soldering pins 20 arranged perpendicularly on the strip 10. The strip 10 with the soldered pins 20 can be plugged into the printed circuit board 7 and soldered at a certain distance relative thereto with parallel plane faces to the printed circuit board.

As a result of the arrangement depicted in the drawings, the light sources 16-19 attain a position whereby the light ray or beam emitted therefrom will impinge the photo-transistors or light sensor 11-14 also provided in a corresponding circular arc 9 on the printed circuit board 7. In order to generate switching impulses, the slotted disc 8 with its modular zone 15 passes within the range of the light beam of the four photocells 3-6 and thereby effects changes in the light intensity impinging upon the photo-transistors 11-14 when the slotted disc 8 is rotated in a cadence depending upon passage of the slots 23. It will be seen that each of the slots 23 is formed with radial edges 21, 22 defining the angular sides of the slots and the shape of the tooth-gap relationship and the rotational speed of the slotted disc 8 will determine modulation of the light impingement upon the light sensors of the photocells and corresponding switching impulses will be generated in the photo-transistors 11-14.

The photocells 3-6 are arranged spaced apart a specific angular distance represented by the angles $\alpha$. It will be noted that the angles $\alpha$ are centered on the center of rotation of the disc 8 and as a result of the arrangement of the photocells 3-6 about the rotational axis of the disc 8, four switching impulses $S_1$, $S_2$, $R_1$, $R_2$ are generated in a timewise staggered relationship sequentially depending upon the rotational speed of the slotted disc 8.

The interval or stagger of the four switching impulses $S_1$, $S_2$, $R_1$, $R_2$ with respect to each other is equal with the exception of that adjustment position of the printed circuit board 7 with respect to the position of the modulator zone 15 of the slotted disc 8 in which the circular arc 9 in the arrangement of the photocells 3-6 overlaps the circular arc 9 of the average radius of the modulator zone 15. If there is assigned a significance to the switching impulses $S_1$, $S_2$, $R_1$, $R_2$ of the photocells 3-6 through transfer onto a switching circuit 24, in accordance with FIG. 5, provided also on the printed circuit board 7, in accordance with which, for example, the switching impulses $S_1$, $S_2$ originating from the light barriers 3, 4 are so designed '37 set"—switching impulses $S_1$, $S_2$ and the following switching impulses $R_1$, $R_2$ correspondingly as "reset"—switching impulses $R_1$, $R_2$ are applied to the inputs S, R of two flip-flops 25, 26, then two rectangular signals 27, 28 staggered 90° with respect to each other are formed at the outputs Q and $\overline{Q}$ of the flip-flops 25, 26.

The signals available at the output of the flip-flops 25 from the rectangular waveforms or signals 27 and 28 in impulse sequences 29 separate from each other and an impulse sequence 30 available at the output side of the flip-flop 26 are transmitted as an input into an electronic calculator for evaluation, for example, for computing price data.

In accordance with official requirements for gauged devices specifying double security for impulse generation, the impulse transmitter in FIGS. 1 and 2, including the switching circuit 24, must have a total of four photocells 3, 4, 5, 6 for the generation of defined rectangular signals. Since, in the mutual, mechanical arrangement of the photocells 3-6 as well as the technological quality, differences are unavoidable, since, however, all photocells 3, 4, 5, 6 are cadenced with the same slotted disc 8, the differences appear in a corresponding form also in the generation of the rectangular signals 27, 28. Over and above that, a mutual correction of the position between the individual photocells 3-6 cannot be accomplished because of the fixed arrangement of the photocells 3-6 on the printed circuit board 7. In order, nevertheless, to achieve a mutual balance of the edges of individual switching impulses $S_1$, $S_2$, $R_1$, $R_2$, the printed circuit board 7 with the four photocells 3-6 is designed as a variably positionable part with reference to the modulator zone 15 of the slotted disc 8 in such a way that, by parallel shifting and rotation of the printed circuit board 7, a balance of an impulse-interval-relationship as well as a mutual stagger of the two impulse sequences 29, 30 is adjustable by means of the thusachievable change in the position of the photocells 3-6. In order to achieve adjustability of the printed circuit board 7, oblong holes 31, 32 are provided on the sides for the adjustment and fixing of the printed circuit board 7 in an optimum position for the location of the switching impulses $S_1$, $S_2$, $R_1$, $R_2$. The adjustment position of the printed circuit 7 is fixed on the support in the housing 1 by means of two attachment screws 34, 35. Because of the oblong holes 31, 32 in the printed circuit board 7, the latter can be subjected to parallel displacement and positional rotation. Thus, the location of the angular position of the photocells 3-6 within the area of the modulator zone 15 is changed. As is demonstrated in the example shown in FIG. 4, displacements of the edges of the rectangular signals 27, 28 toward the right are adjustable by means of a rotation of the printed circuit board 7 and with it of the photocells 3-6 around an imaginary axis 33 in a clockwise direction. With reference to the indicated direction of rotation of the slotted disc 8 in a counterclockwise direction, a timewise retarded stagger of the switching impulses $S_1$, $S_2$, $R_1$, $R_2$ and correspondingly of the rectangular signals 27, 28 at the output of the flip-flops 25, 26 will be thus achieved.

Stated in a very general way, a different angular position of the photocells 3-6 with respect to each other arises through displacement or rotation of the printed circuit board 7 with the four photocells 3-6. Depending thereon, the intervals between the switching impulses $S_1$, $S_2$, $R_1$, $R_2$ change, and this leads to a displacement of the output signals of the flip-flops 25, 26. In this manner, the impulse-interval-relationship and the stagger of one rectangular signal with respect to the other can be balanced. The voltage supply of the switching circuit 24 as well as the transmittal of the impulse sequences 29, 30 from the circuit 24 to the evaluating unit occurs through a multistrand cable 36.

The housing 1 is provided with bores 37, 38 for supporting a shaft 39 which carries the slotted disc 8, and a housing cover 2 is also provided, as shown in FIGS. 1 and 2. Into the portion of the bore 37, which is wider in diameter, a needle free-wheeling device 40 is non-rotatably inserted with respect to the bore which should largely prevent backward clockwise rotation of the shaft 39 in accordance with the embodiment depicted in FIG. 1.

A modulator zone 15 has been provided over the circumference of the slotted disc 8 consisting essentially of a predetermined number of slots 23 which are milled or formed in the radial direction to a certain depth into a disc 41. The disc 41 is riveted onto a sleeve 42 and is non-rotatably connected with the shaft 39 by means of a pin 43. The light transmitting slots 23, which trigger a switching impulse and are also responsible for the impulse shape, are designed to be relatively narrow, taken in comparison with the wide non-light transmitting teeth 44, which, because of the dark zone, determines the mutual interval of the switching impulses at $S_1$, $S_2$, $R_1$, $R_2$. From the presentation in FIG. 4 in which the printed circuit board 7 has been rotated through an angle around an imaginary central axis 33, it will be seen that the photocell 3 which has moved to the inner edge of the modulator zone 15, will cause the largest stagger of the switch impulse $S_1$ in the direction of motion of the slotted disc 8. The smallest stagger in the direction of motion of the disc 8 is experienced by the switching impulse $R_2$ generated by the last photocell 6. If the printed circuit board 7 is rotated in a counterclockwise sense from its central initial position, in accordance with FIG. 3, into a suitable angular position, then depending thereupon, there may be achieved a reverse result with reference to the stagger of the switching impulses $S_1$, $S_2$, $R_1$, $R_2$. The switching impulse $S_1$ thus effected at the photocell 3 exhibits a smaller stagger and switching impulse $R_2$ a correspondingly larger stagger before the switching impulses $S_1$, $S_2$, $R_1$, $R_2$ from the central position of the printed board according to FIG. 3.

In case of only a parallel displacement into the modular zone 15, the angular path is increased, correspondingly the stagger of the switching impulses $S_1$, $S_2$, $R_1$, $R_2$ can be widened. Inversely, the angular path between the photocells 3-6 is reduced in case the printed circuit board 7 is adjusted in a parallel displaced manner in the peripheral area of the modular zone 15. The mutual position of the switching impulses $S_1$, $S_2$, $R_1$, $R_2$ is thus largely adjustable by rotation and parallel displacement of the printed circuit board 7 in the area of the modular zone 15. Erroneous effects upon the generation of the switching impulses $S_1$, $S_2$, $R_1$, $R_2$, for example, because of excessively large rewind tolerances in the needle freewheeling device or caused by the diversified position of the photocells 3-6 and their unequal electrical circuit behavior, can thus be eliminated by a suitable positioning of the printed circuit board 7 in the area of the modulator zone 15.

FIG. 5 shows a circuit diagram of an embodiment including the switching circuit 24 for generation and transformation of the switching impulses $S_1$, $S_2$, $R_1$, $R_2$ of the four photocells 3-6 into defined rectangular waveforms or signals 27, 28. All circuit elements have been provided on the circuit board 7 with the exception of the diodes 16, 17, 18, 19 which must be installed at a certain distance from the photo-transistors 11, 12, 13, 14 and, because of this property, can be plugged onto the printed circuit board 7 by means of soldered pins 20 on the strip 10.

By means of a connection 45 and a protective diode 46 which protects against confusing the poles, a system voltage is applied to the circuit 24 and over a transistor 47 into a stabilization circuit consisting of transistors 48, 49 which assure a constant current for the diodes 16, 17, 18, 19 of the photocells 3-6. Current stabilized by the diodes 16, 17, 18, 19 is again a precondition for a constant, homogeneous light beam for the photocells 3-6. The negative pole on the voltage supply lies at the junction 50. By means of the light signals interrupted by the slotted disc 8, switching impulses $S_1$, $S_2$, $R_1$, $R_2$ are generated in the photo-transistors 13, 14, 11, 12 which are accordingly applied to the inputs S and R of the two flip-flops 25, 26. The two rectangular signals 27, 28 are generated at the outputs Q and $\bar{Q}$ of the flip-flops 25 and 26 which amplified again by the transistors 51, 52 or 53, 54 are applied as an impulse sequence 29 or 30 to the outputs 55 and 56 for further transmittal, for example, to a calculator.

In accordance with the requirements of a pressure-tight encapsulation of the device, the entire switching circuit 24, including the slotted disc 8 as the modulator element, is installed in the housing 1 which consists of two parts including the housing cover 2. The drive of the slotted disc 8 occurs by means of a gear wheel 57 which is attached to the shaft 39 located outside of the housing 1 and is arranged non-rotatably relative to the shaft. The housing 1 as well as the housing cover 2 including the shaft 39 in the housing 1, as well as the run of the multistrand cables 36 to the exterior of the housing 1 are designed in accordance with the specifications for a pressure-tight encapsulation so that the impulse transmitter also satisfies the requirement of the stated embodiment for utilization in explosion-prone areas.

Thus, it will be seen that the present invention comprises a photoelectric impulse transmitter for the conversion of digital measured values in the form of rotary movement into impulses for utilization in a gauge device where the impulses are created by motion of the slotted disc 8 through the light beam of the photocells.

In order to enable generation of appropriate impulse sequences, four photocells 3-6 are provided in a fixed arrangement on the printed circuit board 7 arranged on the circular arc 9 having an average radius of the modulator zone 15. In order to enable it to cope with the critical transient phases in the light-dark area, as well as to eliminate erroneous impulses, because of tolerances in the electrical and mechanical area, the printed circuit board 7 with the four photocells 3-6 is adjustable by parallel displacement and rotation of the position with reference to the modulator zone 15 in such a manner that, through variability of the position of the photocells 3-6, a balance of an impulse-interval-relationship, as well as a mutual stagger of the two impulse sequences 29, 30 is adjustable.

When the disc 8 is rotated through the light beams of the photocells, as the slits 23 pass the light beam, light will be transmitted from one of the light sources of each photocell to the light sensors thereof. When a tooth 44 passes the light beam, then light transmission is interrupted. The alternating light-dark effect generates an impulse in the photo-transistors 11-14, for example, the impulse $S_1$, which is transformed by the circuit according to FIG. 5. The photo-transistors 11-14 thus operate to transform the light beam impinging thereupon into corresponding electrical signals.

If a slotted disc is moving in the indicated rotational direction shown in FIG. 3, then the impulse $S_1$ is generated at the photocell 3 through the occurring intermittent light transmission and the photocells 4, 5 and 6 will analogously generate the impulses $S_2$, $R_1$ and $R_2$. Because of the circuitry shown in FIG. 5, the impulse sequences 29 and 30 are generated from the impulses $S_1$, $R_1$ and $S_2$, $R_2$. The modulator zone 15 is a toothed area extending inwardly from the periphery of the slotted disc 8 and it is referred to as a modulator zone because the light beam paths of the four photocells 4-6 are "modulated" by the toothed area in order to control the intermittent light transmission so as to intermittently energize and deenergize the photocells. If a slit 23 is passed through a beam of a photocell 3-6, then, for a short time light is transmitted to the photo-transistors 11-14 by means of which an S or R impulse is set. The photocells 3 and 5 as well as 4 and 6 act together and generate at the output of the circuit shown in FIG. 5 the impulse sequences 29 and 30. Rectangular impulse sequence 29 at the output of the flip-flop 25 occurs by the set impulse $S_1$ initiating the leading edge of the rectangular signal 27, with the reset impulse $R_1$ generating the trailing edge. For the impulse sequence 30, these are analogously the impulses $S_2$ and $R_2$ which generate the rectangular signals at the output of the flip-flop 25.

Figure 4:
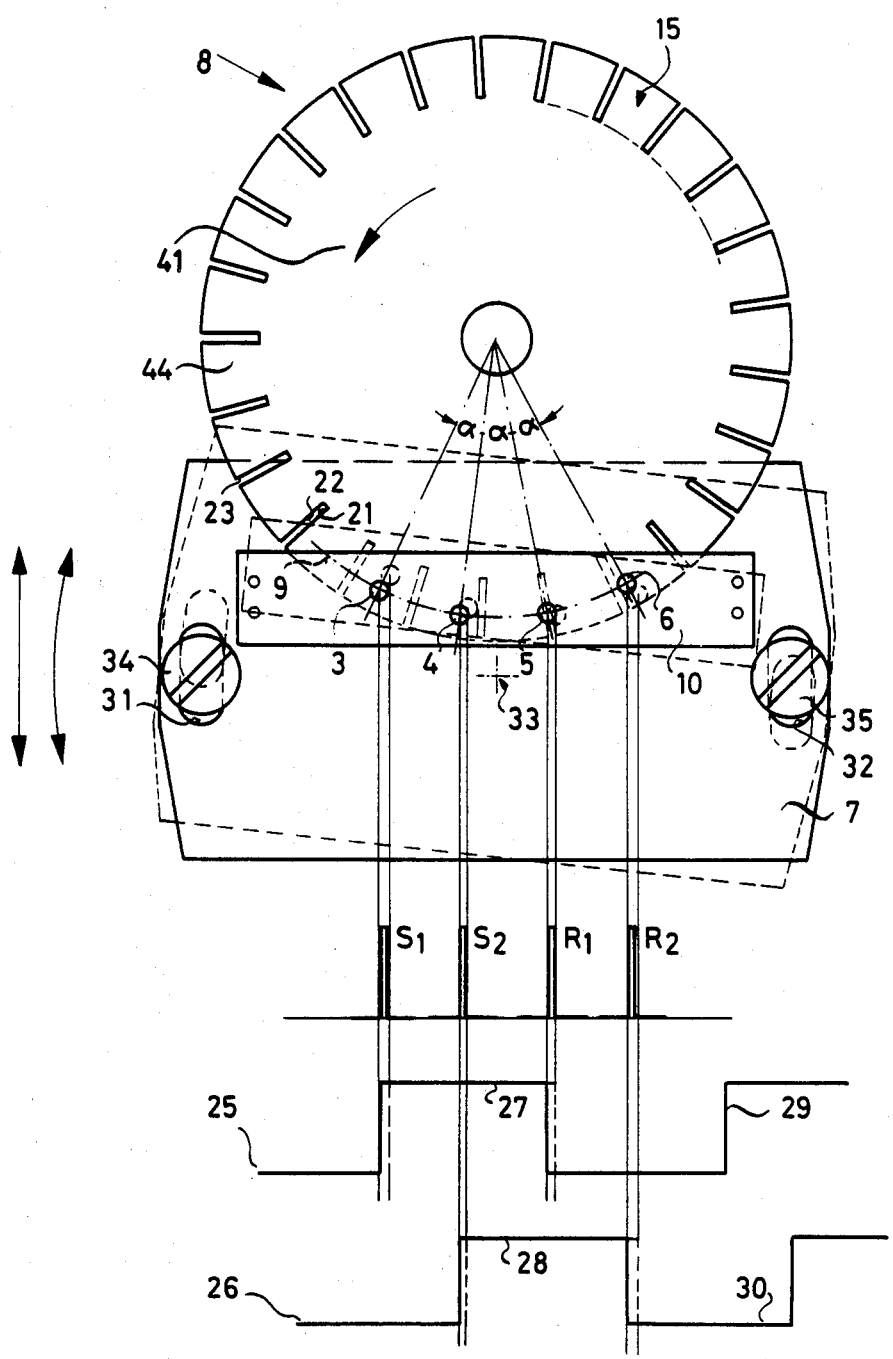
FIG. 4 is a schematic representation according to FIG. 3 showing the device in its adjusted position with the graphical illustration of the waveforms depicting changes therein as a result of the adjustment which has been made.

By displacement or twisting, as shown in dotted line in FIG. 4, of the photocells 3-6, they will be moved into another operating position taken relative to the slots 23. With this, the position of the set and rest impulses $S_1$, $S_2$, $R_1$, $R_2$ is also displaced and thereby also analogously the leading and trailing edges of signals 29 and 30 at the output of the flip-flops 25 and 26.

Differing angular zones on the disc 8 change the location of the impulses $S_1$, $S_2$, $R_1$, $R_2$ and with this also the position of the leading or trailing edges of the signals 29, 30. In the example according to FIG. 4, twisting of the printed circuit board 7 into the position indicated in dotted line entails a shifting of the location of the leading and trailing edges toward the right.

Thus, as will be seen in accordance with the explanation set forth above, the position of the rectangular signals and the pause intervals or the intervals where no signal is generated may be adjustable because of the offset of the edges of the signal. As will be seen from FIG. 4, in the case there indicated, twisting of the printed circuit board 7 causes the leading edge of the signal 30 to be displaced considerably less toward the right than the trailing edge of the same rectangular wave, meaning that the rectangular signal 28 is, in the first place, moved toward the right and, in the second place, at the same time, increased in its impulse width whereby the phase where no signal is generated becomes narrower when the printed circuit board 7 is twisted from its mid-position in accordance with FIGS. 3 and 4. Thus, it is possible to change the position of the setting impulses S and the resetting impulses R by offsetting or moving the printed circuit board 7 whereby the relationship of the signal length to non-signal length can be adjusted within certain limits.

A mutual offset of the two impulse sequences or waveforms 29 and 30 is also achievable, as will be seen from FIG. 4. The impulse $S_1$ and with this the leading edge of the signal 29 will move a greater distance to the right than the impulse $S_2$ or the leading edge of the signal 30 whereby the leading edges of the two impulse sequences have moved closer to each other in the example shown. Deviating from the indicated example in FIG. 4, displacement in the opposite direction is also possible in such a manner that the leading or rising edges move away from each other.

In this rather simple manner involving a simple mechanical displacement or adjustment of the printed circuit board 7, the impulse-interval-relationship as well as the mutual stagger or offset of the impulse sequences can be adjusted.

Thus, from the foregoing, it will be apparent that, in the operation of the device of the present invention, one or more square waves are generated each having a leading edge and a trailing edge. Each of the photocells 3-6 operates to generate one of the leading edges or trailing edges of the square waves. For example, the photocell 3, when it emits the pulse $S_1$, will essentially generate the leading edge of the waveform 29 through the flip-flop 25. The photocell 5, by emitting the reset impulse $R_1$, generates the trailing edge of the waveform 29. Similarly, the photocells 4 and 6, by emitting, respectively, the impulses $S_2$ and $R_2$, will essentially define the leading edge and the trailing edge, respectively, of the waveform 30.

By shifting the position of the photocells 3 - 6, by adjustment of the printed circuit board 7 in the manner previously described, the location or timing of the leading and trailing edges may be adjusted or altered, thereby to effect the balance of the impulse-interval-relationship as mentioned above.

Similarly, by shifting the leading and trailing edges of each of the two waveforms in the manner previously described, since the waveforms are staggered as indicated in FIGS. 3 and 4, the mutual stagger of the two impulse sequences or the staggered interrelationship thereof may also be adjusted by shifting the printed circuit board 7.

While specific embodiments of the invention have been shown and described in detail to illustrate the application of the inventive principles, it will be understood that the invention may be embodied otherwise without departing from such principles.

What is claimed is:

1. A photoelectric impulse transmitter for converting measured values into electrical impulses for gauge devices or the like, comprising a slotted disc rotatable about an axis having slotted portions formed therein with angularly spaced radial slots, said slots extending along an annular portion of said disc to define a modulator zone thereon, four photoelectric cells mounted on a printed circuit board in a fixed arrangement in the form of a circular arc having a radius which is the average radius of said modulator zone, said photoelectric cells being spaced apart at equal rotational angular intervals and emitting electrical impulses in accordance with the rotational movement of said slotted disc relative thereto, and adjustment means for enabling positional adjustment of said printed circuit board and of said four photoelectric cells in tandem by parallel displacement and rotation of the position thereof with reference to said modulator zone in such a manner that as a result of the variability of the position of said photoelectric cells, a balance of an impulse-interval-relationship as well as a mutual stagger of the sequence of said impulses emitted thereby is capable of adjustment.

2. A photoelectric impulse transmitter according to claim 1, wherein said photoelectric cells each consist of one light transmitter in the form of a diode and one light receiver in the form of a photo-transistor, whereby said diodes are provided on a strip which can be plugged into said printed circuit board so that the planes of said strip and said printed circuit board are parallel with each other and wherein said photo-transistors are integrated on said printed circuit board in the area of the light ray path of said diodes.

3. A photoelectric impulse transmitter according to claim 2, wherein said printed circuit board includes a circuit consisting of transistors for stabilization of the current for said diodes.

4. A photoelectric impulse transmitter according to claim 1, further comprising electrical circuitry including a pair of flip-flops having inputs, said printed circuit board having thereon a printed circuit including a circuit arrangement by means of which light impulses cadenced by said slotted disc and magnified by said photocells are applied directly to said inputs of said two flip-flops, said flip-flops operating to generate rectangular signals at the outputs thereof.

5. A photoelectric impulse transmitter according to claim 4, further comprising transistors arranged on said printed circuit board, wherein the rectangular signals at the outputs of said flip-flop are magnified by the transistors switched after them and then applied to the outputs of said impulse transmitter.

6. A photoelectric impulse transmitter according to claim 1, further comprising a pressure-tight housing made in two parts having said photoelectric cells and said printed circuit board integrated therein as a fixed structural member.

7. A photoelectric impulse transmitter for converting measured values into impulses for guage devices or the like, comprising:
a plurality of photoelectric cells each including a light source and a light sensor arranged on a generally circular arc having a radius;
a disc rotatable about an axis having slotted portions formed with angularly spaced radial slots arranged for movement along said circular arc between said light sources and said light sensors to intermittently transmit and block light therebetween thereby to intermittently energize and deenergize, respectively, each of said photocells in accordance with the angular spacing of said slots, said slots extending along an annular portion of said disc to define a modulator zone thereon;
electrical circuit means having said photocells connected therein for emitting electrical pulses responsive to energization and deenergization of said photocells; and
adjustment means enabling adjustable positioning of said photocells in tandem relative to said axis and relative to said modulator zone thereby to enable adjustability with regard to said emitting of said electrical pulses.

8. A photoelectric impulse transmitter according to claim 7, wherein said electrical circuit means emits said electrical pulses in the form of square waves having a leading edge and a trailing edge and wherein positioning of said photocells by operation of said adjustment means operates to vary the timing of at least one of said leading edge and said trailing edge.

9. A photoelectric impulse transmitter according to claim 8, wherein each of said photocells emits an impulse defining one of said leading edge and said trailing edge of a square wave.

10. A photoelectric impulse transmitter according to claim 9, wherein a plurality of said square waves are generated and wherein said square waves are generated in a staggered arrangement, said photocells operating through said electrical circuit means to vary the staggered arrangement of said square waves.

* * * * *